(12) United States Patent
Udagawa et al.

(10) Patent No.: US 6,346,719 B1
(45) Date of Patent: Feb. 12, 2002

(54) ALGAINP LIGHT-EMITTING DIODE

(75) Inventors: Takashi Udagawa; Toshiki Yoshiuji; Ryouichi Takeuchi, all of Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/599,725

(22) Filed: Jun. 23, 2000

Related U.S. Application Data
(60) Provisional application No. 60/203,927, filed on May 12, 2000.

(30) Foreign Application Priority Data

Jun. 24, 1999 (JP) ............................................ 11-178320

(51) Int. Cl.[7] ............................................. H01L 33/00
(52) U.S. Cl. ............................ 257/94; 257/96; 257/101; 257/103
(58) Field of Search ............................. 257/94, 96, 101, 257/103

(56) References Cited

U.S. PATENT DOCUMENTS

| 5,811,839 A | * | 9/1998 | Shimoyama et al. | ......... 257/94 |
| 6,163,037 A | * | 12/2000 | Matsumoto | .................. 257/101 |
| 6,278,137 B1 | * | 8/2001 | Shimoyama et al. | ........ 257/102 |
| 2001/0013609 A1 | * | 8/2001 | Abe | ........................... 257/101 |

* cited by examiner

*Primary Examiner*—Sara Crane
(74) *Attorney, Agent, or Firm*—Sughrue Mion, PLLC

(57) ABSTRACT

An object of the present invention is to provide a high brightness n-side-up type AlGaInP light-emitting device with a simple structure. An n-type upper cladding layer is constructed by superimposing three n-type AlGaInP layers with different electron concentrations. The relationship between the electron concentrations of the three n-type AlGaInP layers is $n_3 > n_1 > n_2$.

11 Claims, 6 Drawing Sheets

ALGAINP LIGHT-EMITTING DIODE

CROSS REFERENCE TO RELATED APPLICATIONS

This application is an application filed under 35 U.S.C. §111(a) claiming benefit pursuant to 35 U.S.C. §119(e)(1) of the filing date of Provisional Application No. 60/203,927 filed May 12, 2000 pursuant to 35 U.S.C. §111(b).

FIELD OF THE INVENTION

The present invention relates to a high brightness AlGaInP light-emitting diode which comprises an upper cladding layer including three layers with different electron concentrations, and a metal oxide window layer.

BACKGROUND OF THE INVENTION

As a light-emitting device with a band from green, yellow to reddish orange, an aluminum.gallium.indium phosphide (AlGaInP) light-emitting diode (LED) with a pn junction-type double-hetero (DH) junction structure is known (Appl. Phys. Lett., 61(15)(1992), pp. 1775–1777). In particular, $(Al_\alpha Ga_{1-\alpha})_{0.5}In_{0.5}P$ $(0 \leq \alpha \leq 1)$ with an indium composition ratio of about 0.5 has an advantage of being capable of achieving excellent lattice matching with a gallium arsenide (GaAs) single crystal (Appl. Phys. Lett., 57(27)(1990), pp. 2937–2939). Therefore, it is used to construct a cladding layer which constitutes a light-emitting portion with a DH junction structure, or a light-emitting layer (active layer) (Appl. Phys. Lett., 58(10)(1991), pp. 1010–1012).

The LED in which the cladding layer on the side from which light is emitted is constructed of an n-type layer is referred to as n-side-up type LED, while the LED in which the cladding layer on the side from which light is emitted is constructed of a p-type layer is referred to as p-side-up type LED. In any of the above layered structures, the cladding layers which hold the light-emitting layer therebetween extend over a large area of the light-emitting layer, and are usually composed of $(Al_\alpha Ga_{1-\alpha})_{0.5}In_{0.5}P$ $(0 \leq \alpha \leq 1)$ doped with an n-type or p-type impurity with high concentration in order to cause a device operating current to flow (Japanese Laid-Open Patent Application 2-168690). Furthermore, the electron concentration or hole concentration inside the cladding layers is generally made approximately constant (Japanese Laid-Open Patent Application 2-260682).

In a conventional high brightness AlGaInP LED, a window layer for efficiently picking out light emission from the light-emitting portion is provided above the upper cladding layer (SPIE, Vol. 3002 (1997), pp. 110–118). The window layer is required to be constructed of a semiconductor material which is transparent to the light emitted, and has a large forbidden band gap. Conventionally, an example constructed of aluminum.gallium arsenide crystal ($Al_cGa_{1-c}As$: $0 \leq C \leq 1$) is known (the above-mentioned Appl. Phys. Lett., 58(1991)) and an example constructed of gallium phosphide (J. Electron. Mater., 20 (1991), pp. 1125–1130).

In addition to the III-V group compound semi-conductor materials, for example, U.S. Pat. No. 5,481,122 discloses the use of a metal oxide window layer constructed of indium-tin oxide (abbreviated to ITO). Furthermore, there is disclosed means for providing a transparent oxide layer composed of a film made of indium oxide, tin oxide, zinc oxide, or magnesium oxide (Japanese Laid-Open Patent Application 11-17220). Some metal oxide has a room temperature forbidden band gap as high as above 3 eV, and is better in picking out light emission compared to the III-V group compound semiconductors conventionally used as the construction materials for the window layer.

A problem that is caused when a transparent window layer made of a metal oxide with an n-type conductivity, such as ITO, is provided on the upper cladding layer composed of an n-type $(Al_\alpha Ga_{1-\alpha})_{0.5}In_{0.5}P$ $(0 \leq \alpha \leq 1)$ by junction, is that a metal oxide layer with a low ohmic contact resistance cannot be formed in a stable manner. For this reason, conventionally, a contact layer with high n-type carrier concentration (=electron concentration) which exceeds about $1 \times 10^{19}$ cm$^{-3}$ is usually provided on the n-type cladding layer (the above-mentioned Japanese Laid-Open Patent Application 11-17220). The contact layer is constructed of gallium arsenic phosphide (GaAP), gaium phosphide (GaP), gallium indium phosphide (GaInP), or gallium arsenide (GaAs) (the above-mentioned Japanese Laid-Open Patent Application 11-17220) and has a problem that the layered structure thereof is complex.

The present invention has been made in view of the above-mentioned problems in the prior art, and provides an n-side-up type AlGaInP light-emitting diode provided with a window layer made of a metal oxide, wherein the light-emitting diode is a high brightness LED with a simple layered structure.

SUMMARY OF THE INVENTION

The inventors of the present invention have studied diligently to solve the above-mentioned problems, and finally arrived at the present invention. The present invention is directed to the light-emitting diodes described below:

(1) A light-emitting diode comprising a p-type GaAs single crystal substrate on which a p-type lower cladding layer, a light-emitting layer, and an n-type upper cladding layer are provided, each layer being represented by $(Al_X Ga_{1-X})_Y In_{1-Y}P$ $(0 \leq X \leq 1, 0 \leq Y \leq 1)$(including the case where each layer has different mixed crystal ratios X, Y), and a window layer composed of a metal oxide, characterized in that the n-type upper cladding layer includes three layers, each layer having a different electron concentration (including the case where each of the three layers has different mixed crystal ratios X, Y, the three layers being referred to as a first n-type layer (with an electron concentration of n1 and a layer thickness of d1), a second n-type layer (with an electron concentration of n2 and a layer thickness of d2), and a third n-type layer (with an electron concentration of n3 and a layer thickness of d3) counted in the order from the layer on the side near the light-emitting layer), with the electron concentrations of the three layers being in the relationship of n3>n1>n2.

(2) The light-emitting diode as described in (1) above, wherein the mixed crystal ratio (1−Y) of In in each of the p-type lower cladding layer, the light-emitting layer, and the n-type upper cladding layer is 0.5.

(3) The light-emitting diode as described in (1) or (2) above, wherein the window layer is in contact with the third n-type layer.

(4) The light-emitting diode as described in any of (1) to (3) above, wherein the layer thicknesses of the first to third n-type layers are in the relationship of d1>d3≧d2.

(5) The light-emitting diode as described in any of (1) to (4) above, wherein the electron concentration of the second n-type layer is $1 \times 10^{16}$ cm$^{-3}$ ≦ n2 ≦ $5 \times 10^{17}$ cm$^{-3}$.

(6) The light-emitting diode as described in any of (1) to (5) above, wherein the layer thickness of the second n-type layer is 20 nm ≦ d2 ≦ 200 nm.

(7) The light-emitting diode as described in any of (1) to (6) above, wherein a dopant for the first and second n-type layers is Si, and a dopant for the third n-type layer is Se or Te.

(8) The light-emitting diode as described in any of (1) to (7) above, wherein the window layer has an n-type conductivity.

(9) The light-emitting diode as described in any of (1) to (8) above, wherein the window layer is constructed of at least one material selected from the group consisting of indium-tin oxide, indium oxide, tin oxide, zinc oxide, and magnesium oxide.

(10) The light-emitting diode as described in (9) above, wherein the zinc oxide of which the window layer is constructed comprises one of aluminum, gallium, or indium.

(11) The light-emitting diode as described in any of (1) to (10) above, wherein the p-type GaAs single crystal substrate has an electron concentration in the range of $5\times10^{18}$ to $5\times10^{19}$ cm$^{-3}$.

DESCRIPTION OF THE PREFERRED EMBODIMENTS

Figure 1:
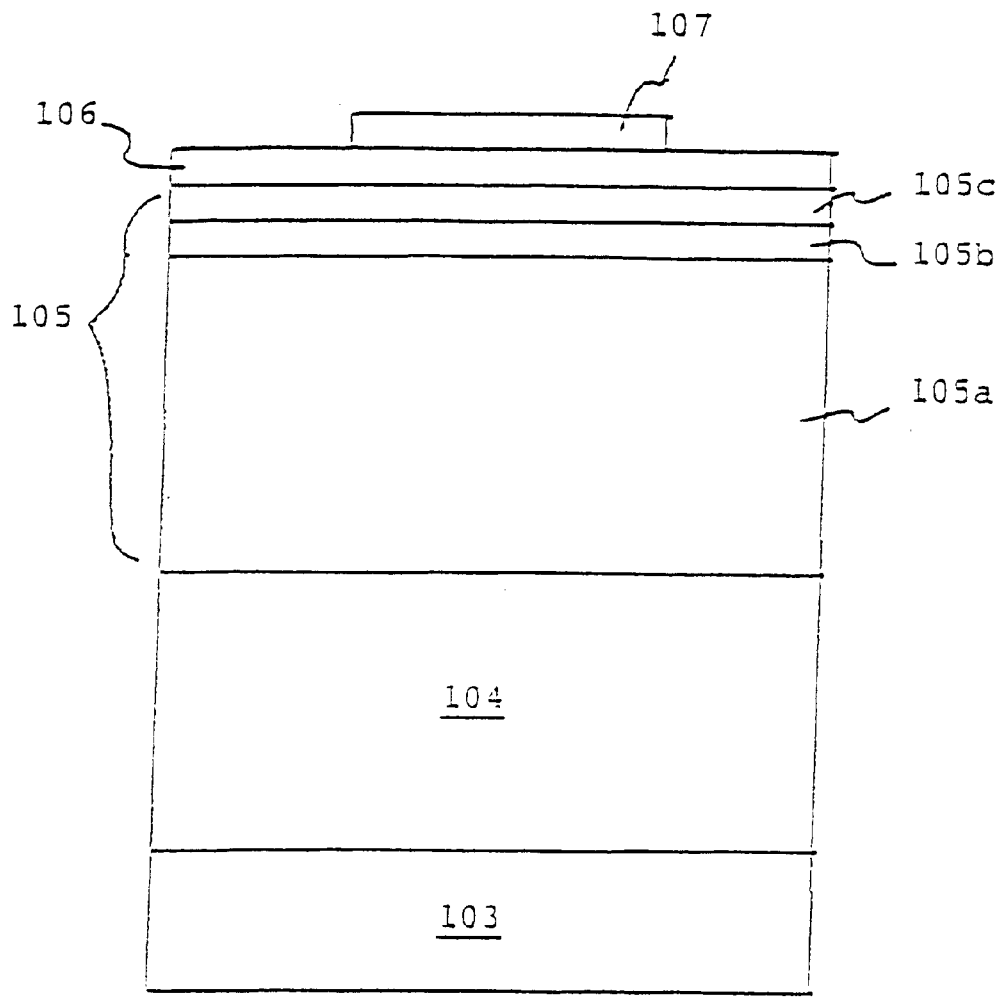
FIG. 1 is a schematic view showing a section structure of an upper cladding layer provided with such a layered structure as in the present invention.

An embodiment of the present invention will be explained with reference to FIG. 1. In an $(Al_xGa_{1-x})_yIn_{1-y}P$ ($0\leq X\leq 1$, $0\leq Y\leq 1$) light-emitting diode of the present invention, excellent lattice matching with a GaAs single crystal substrate can be obtained, in particular, when the composition ratio of indium is set to about 0.5.

A p-type GaAs single crystal substrate is used as the substrate. An electroconductive substrate is favorable for fabrication of a device, preferably having an electron concentration in the range of $5\times10^{18}$ to $5\times10^{19}$ cm$^{-3}$.

In the present invention, an n-type upper cladding layer 105 composed of $(Al_xGa_{1-x})_{0.5}In_{0.5}P$ ($0\leq X\leq 1$), which is disposed between a window layer 106 composed of a metal oxide semiconductor with an n-type conductivity and a light-emitting layer 104, is constructed of three layers 105a to 105c with different electron concentrations. It is desirable that the electron concentration of the first n-type layer 105a on the side of the n-type or p-type light-emitting layer 104 be $1\times10^{17}$ cm$^{-3}$ or more and $5\times10^{18}$ cm$^{-3}$ or less. When the n-type layer 105a is turned into a high carrier concentration layer by doping with a large amount of n-type impurities, a large amount of n-type impurities are diffused into the light-emitting layer 104, so that the steepness in composition between the light-emitting layer 104 and the n-type layer 105a is impaired. Monochromaticity of light emission is thus unfavorably damaged. The electron concentration of the n-type layer 105a can be attained by doping with impurities, such as Si and Sn belonging to group IV, or Se and Te belonging to group VI. In light of the purpose for controlling the diffusion of n-type impurities into the light-emitting layer 104, Si is a preferable dopant because the diffusion constant thereof is smaller than those of impurities belonging to group VI.

The electron concentration of a second n-type $(Al_xGa_{1-x})_{0.5}In_{0.5}P$ ($0\leq X\leq 1$) layer 105b is controlled to be less than that of the first n-type layer. Further, the electron concentration of the first n-type layer is controlled to be less than that of a third n-type layer 105c to be described later. When the electron concentration of the second n-type layer 105b is made smaller than those of the first and third n-type layers 105a and 105c, the second n-type layer acts as a resistor against a device driving current flowing from an electrode 107 through the window layer 106 and the third n-type layer 105c. In other words, the driving current can be widely diffused in the light-emitting layer 104.

An optimum range of the electron concentration of the second n-type layer 105b is $1\times10^{16}$ cm$^{-3}$ or more and $5\times10^{17}$ cm$^{-3}$ or less. A lower electron concentration, that is, less than $1\times10^{16}$ cm$^{-3}$, will excessively increase a forward voltage; while an electron concentration over $5\times10^{17}$ cm$^{-3}$ will lower the resistivity, which will inhibit the driving current from being widely diffused. When an $(Al_xGa_{1-x})_{0.5}In_{0.5}P$ ($0\leq X\leq 1$) layer constituting the second n-type layer 105b is taken as an example, the optimal electron concentration thereof may be obtained by the metal organic chemical vapor deposition (MO-CVD) method under an undoped condition with no intentional addition of n-type impurities. However, the electron concentration can be controlled in a more stable manner by using an element belonging to group IV or VI as the n-type dopant in a controlled amount. In view of the reduction of the amount of dopant that penetrates into the light-emitting layer 104, Si with minimum diffusion is suitable as the n-type dopant in a similar manner as in the first n-type layer 105b.

It is preferable that the layer thickness of the second n-type layer 105b be less than or equal to that of the third n-type layer, and that the layer thickness of the third n-type layer be less than that of the first n-type layer. When the layer thickness of the second n-type layer is more than or equal to that of the first n-type layer, a forward voltage is unfavorably increased. In addition, when the layer thickness of the third n-type layer is less than that of the second n-type layer, the driving current cannot be sufficiently diffused, so that the light-emitting area is disadvantageously curtailed. It is appropriate that the layer thickness of the second n-type layer be 20 nm or more and 200 nm or less. The layer thickness of the second n-type layer can be easily controlled by adjusting the time for film formation of the second n-type layer.

The electron concentration of the third n-type layer 105c is made larger than the electron concentrations of the first and the second n-type layers, and is increased to secure a superior ohmic contact property with the metal oxide window layer constituting the window layer 106, and to diffuse the driving current in the third n-type layer 105c in a plane direction thereof. The electron concentration of the third n-type layer 105c is set to at least about $1\times10^{18}$ cm$^{-3}$ or more, and preferably $5\times10^{18}$ cm$^{-3}$ or more. A high carrier concentration over $5\times10^{19}$ cm$^{-3}$ will disturb the evenness of the surface. As a result, a stable metal oxide window layer with a superior ohmic contact property cannot be obtained. As the n-type impurities for forming such a high carrier concentration n-type $(Al_xGa_{1-x})_{0.5}In_{0.5}P$ ($0 \leq X \leq 1$) layer, Se and Te belonging to group VI are preferable to Si.

Figure 2:
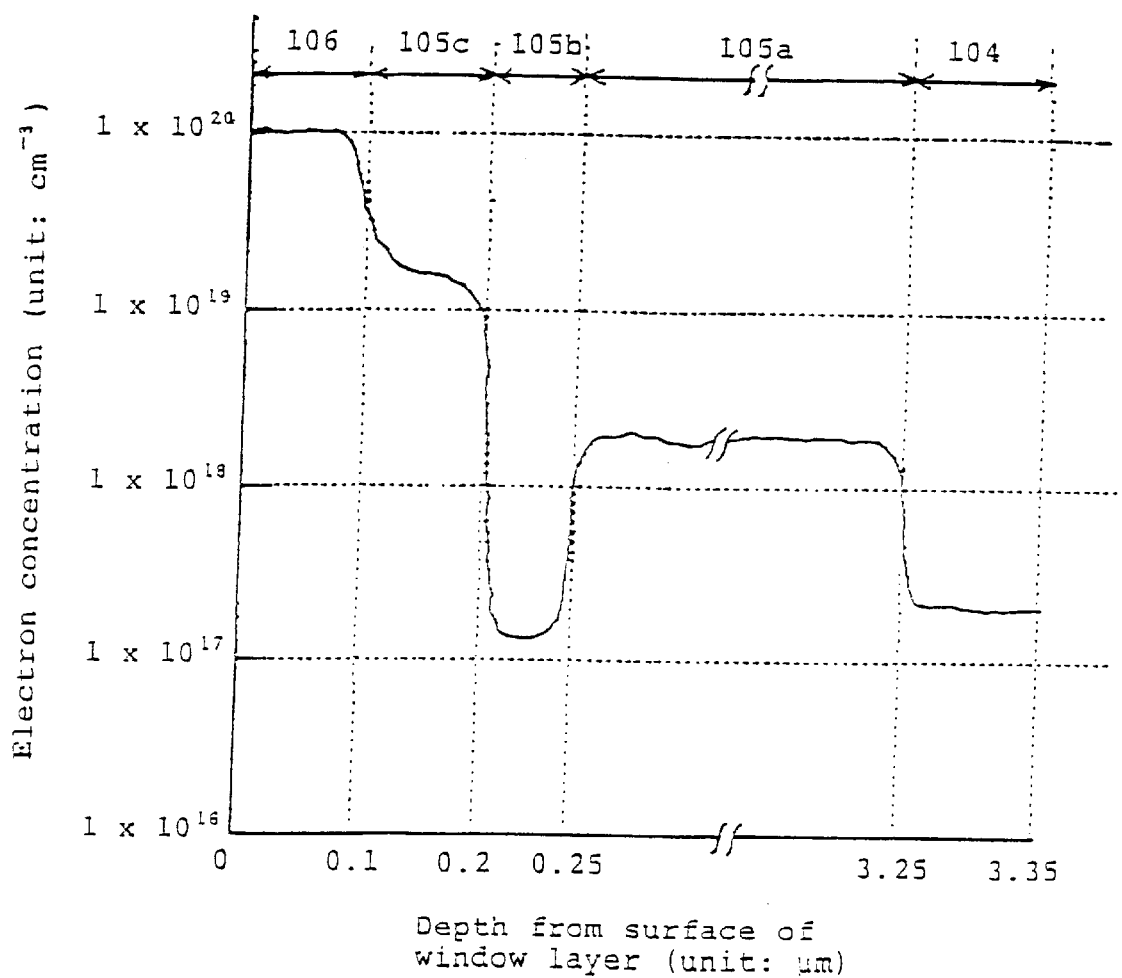
FIG. 2 is a schematic diagram showing one example of a distribution manner of electron concentration in an upper cladding layer.
Figure 3:
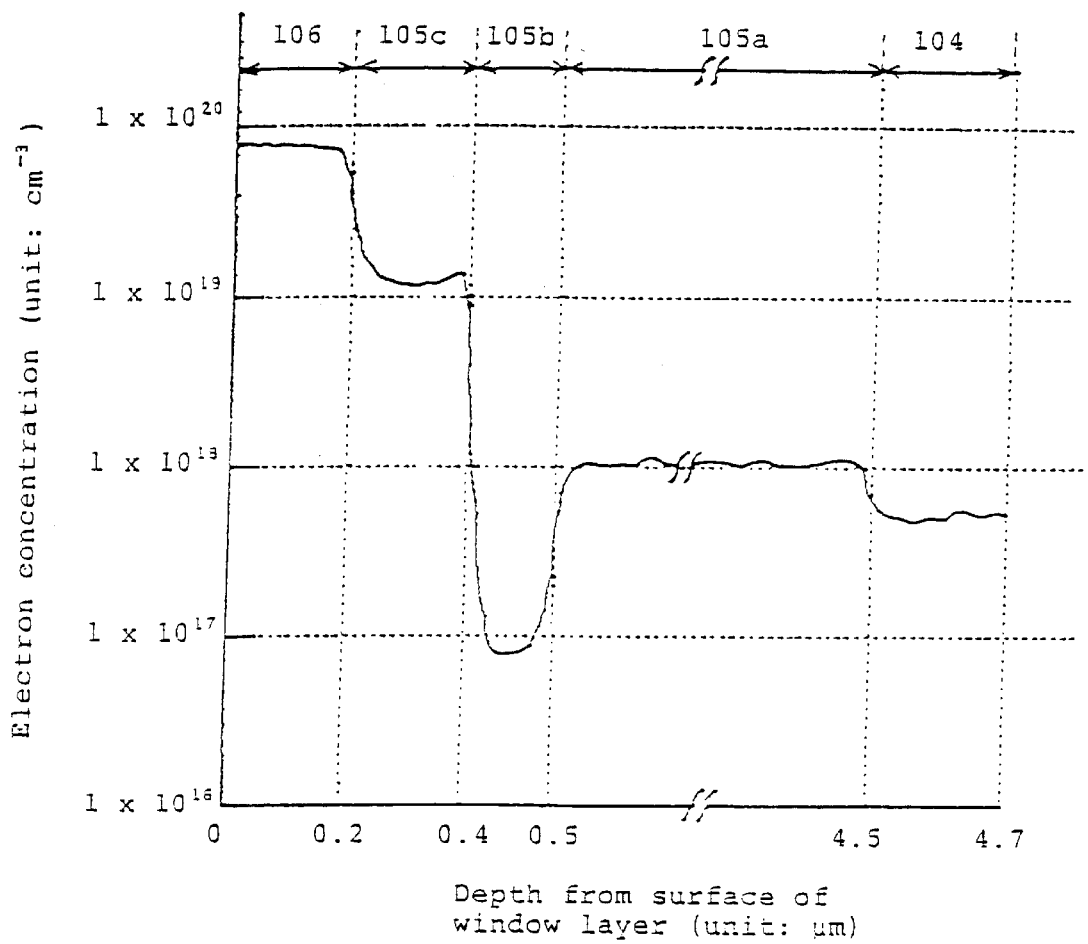
FIG. 3 is a schematic diagram showing another example of a distribution manner of electron concentration in an upper cladding layer.

FIG. 2 shows one example of a distribution manner of electron concentration in an n-type upper cladding layer 105 comprising the first to third n-type layers 105a to 105c. In this case, the electron concentration of the upper cladding layer 105 changes stepwise according to the electron concentration of each of the n-type layers 105a to 105c. FIG. 3 shows another example of a distribution manner of electron concentration in an upper cladding layer 105, where the electron concentration of each layer is changed in a relatively moderate way when compared with the case of FIG. 2. To continuously change the electron concentration in such a way, the amount of an n-type dopant to be added may be varied with time in the formation of the n-type $(Al_xGa_{1-x})_{0.5}In_{0.5}P$ ($0 \leq X \leq 1$) layer, or the film forming temperature may be increased or decreased. The electron concentration can be measured by generally used capacitance-voltage (C-V) method using a Schottky junction type electrode.

The third n-type layer 105c may serve as an ohmic contact layer with the n-type metal oxide window layer. Therefore, it is not necessary to excessively increase the layer thickness of the third n-type layer. A thickness of 5 nm or more is enough. A thin layer with a thickness of about 2 to 3 nm or less cannot be a continuous film capable of uniformly covering the entire surface of the second n-type layer. As a result, a superior ohmic contact property with the window layer cannot be obtained, and the driving current cannot be sufficiently diffused in the third n-type layer 105c in a plane direction thereof. When the layer thickness exceeds about 500 nm, the total amount of dopants which are contained in the layer and apt to be easily diffused will increase. Therefore, there is an increased chance that a large quantity of dopant will penetrate into the light-emitting layer, thereby impairing the monochromaticity of light emission.

The above-mentioned first n-type layer 105a is a layer which also serves to restrict the amount of the n-type impurity that penetrates into the light-emitting layer from the side of the third n-type layer 105c. Therefore, it is desirable that the layer thickness of the first n-type layer be controlled to be at least more than the layer thickness of the third n-type layer 105c. It is appropriate to set the layer thickness of the first n-type layer 105a at more than about 0.5 μm when the temperature commonly set at approximately 700° C. in the course of formation of the n-type $(Al_xGa_{1-x})_{0.5}In_{0.5}P$ ($0 \leq X \leq 1$) layer by the MO-CVD method is taken into consideration. The amount of n-type impurity to be diffused into the light-emitting layer 104 can be reduced as the layer thickness of the first n-type layer 105a is increased.

According to the present invention, the n-type metal oxide window layer 106 is provided on the third n-type layer 105c. It is preferable that both layers come in contact with each other to simplify the structure of a device. As the metal oxide, for example, ITO, indium oxide, tin oxide, zinc oxide, and magnesium oxide can be used. In particular, n-type zinc oxide (chemical formula: ZnO) is preferably employed. Unlike ITO, which is a mixture of indium oxide and tin oxide, zinc oxide, which is a single substance, has the advantage of superior reproducibility of its resistivity because the variation of resistivity caused by the change of mixing ratios of the constituents is little. The forbidden band gap of zinc oxide is as large as about 3.35 eV at room temperature (Iwao Teramoto, "*Introduction to Semiconductor Device*" (Baifukan, Mar. 30, 1995), p. 28 Table 2.3). Accordingly, zinc oxide has a high transmittance of about 90% with respect to, for example, yellowish orange light with a wavelength ranging from 600 nm to 630 nm emitted from an $(A_xGa_{1-x})_{0.5}In_{0.5}P$ ($0 \leq X \leq 1$) LED.

Zinc oxide crystal is a compound semiconductor belonging to group II-VI capable of showing an n-type conductivity in an undoped state. An n-type zinc oxide window layer with a lower specific resistance can be surely formed, in particular, by doping with an element belonging to group III. An n-type zinc oxide film doped with the elements belonging to group III, such as aluminum (symbol of element: Al), gallium (symbol of element: Ga), and indium (symbol of element: In) shows a specific resistance of about $2 \times 10^{-4}$ to $3 \times 10^{-4}$ Ω·cm, and is preferably employed as the construction material for the window layer. The electron concentration is preferably about $1 \times 10^{20}$ cm$^{-3}$. For instance, an n-type zinc oxide film to which both Al and Ga are added shows a low specific resistance, so that it is a suitable material for constituting the window layer. The specific resistance of the zinc oxide crystal layer can be measured by the conventional Hall effect measurement method or the like.

On the surface of the third n-type layer 105c, the window layer 106 constructed of the n-type zinc oxide can be formed by conventional physical vapor deposition methods such as radio-frequency sputtering and vacuum evaporation, and chemical vapor deposition (CVD) methods. For example, the layer can be formed by sputtering using a molded material comprising zinc oxide, and an aluminum impurity in an amount of about 2 to 5 wt. % as a target. Alternatively, the film formation can be achieved in such a manner that the surface of the above-mentioned target material is irradiated with laser beams by the laser ablation method. It is desirable that the layer thickness of the zinc oxide window layer be about 5 nm or more. When the layer thickness exceeds about 5 μm, the surface evenness of the zinc oxide layer is lowered. As a result, light emission intensity in the surface becomes uneven.

EXAMPLES

The present invention will now be explained in greater detail with reference to the Examples. Unless otherwise indicated herein, all parts, percents, ratios and the like are by weight.

Example 1

Figure 4:
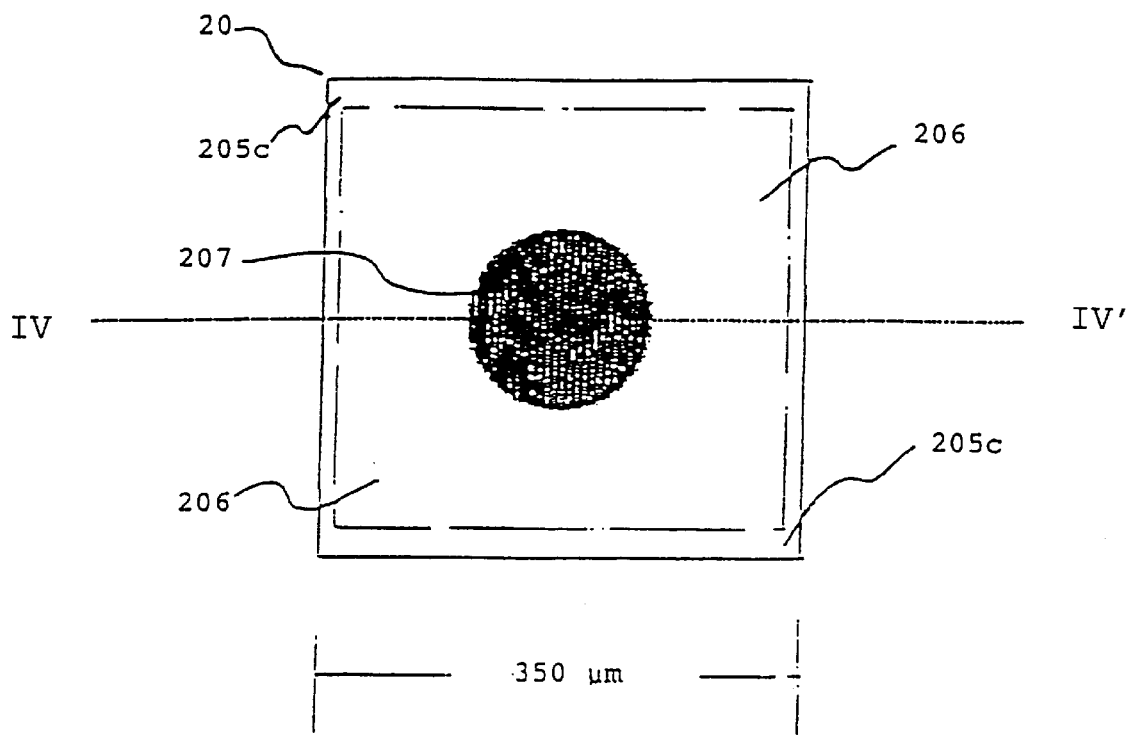
FIG. 4 is a schematic plan view of an LED described in Example 1.
Figure 5:
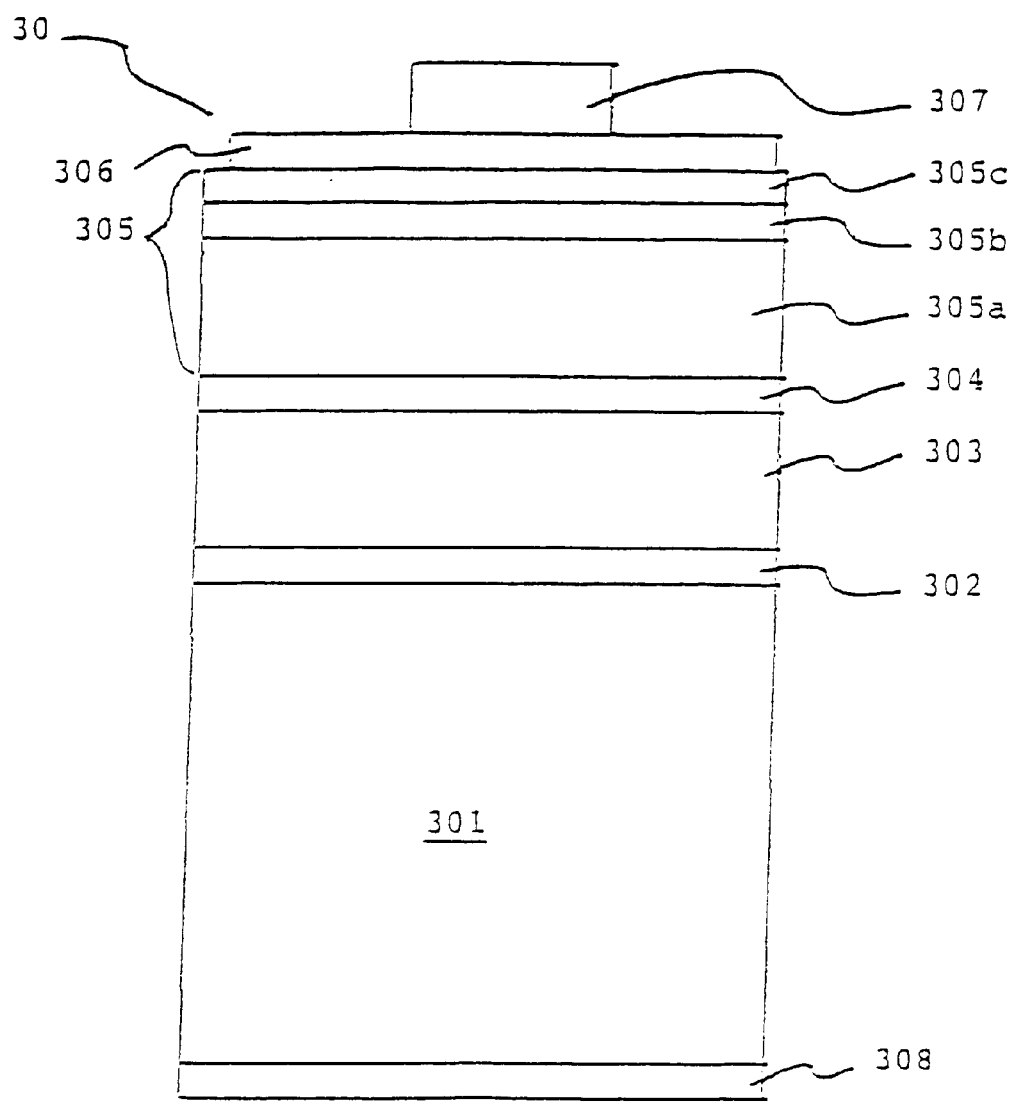
FIG. 5 is a schematic section of the LED of FIG. 4, taken on a broken line IV–IV'.

The present invention will now be explained in detail with reference to the example. FIG. 4, is a schematic plan view of an LED 20 which is an example of the present invention. FIG. 4 shows a circular electrode 207 provided on a window layer 206, which is overlaid on an upper cladding layer 205c. The broken line IV–IV' represents the line where the cross section of the LED 20 is taken and shown in FIG. 5. FIG. 5 is a schematic view of the LED 20, showing the structure thereof in the cross section, taken on a broken line IV–IV' in FIG. 4.

On a Zn doped p-type (001)-GaAs single crystal substrate 301 (electron concentration: $8 \times 10^{18}$ cm$^{-3}$), with 4° off in the [110] direction, there were successively overlaid a Zn doped p-type GaAs buffer layer 302, a lower cladding layer 303 composed of a Zn doped p-type $(Al_{0.7}Ga_{0.3})_{0.5}In_{0.5}P$, and a light-emitting layer 304 composed of an undoped $(Al_{0.2}Ga_{0.8})_{0.5}In_{0.5}P$ mixed crystal. Film formation of the buffer layer 302, the-p-type lower cladding layer 303 and the light-emitting layer 304 was conducted at 720° C. by a low pressure MO-VPE method, using trimethyl aluminum ((CH$_3$)$_3$Al), trimethyl gallium ((CH$_3$)$_3$Ga), and trimethyl indium ((CH$_3$)$_3$In) as the raw materials for group III constituent elements, and phosphine (PH$_3$) as a group V constituent element source. As a doping source for Zn, diethylzinc (($C_2H_5)_2Zn$) was used. The positive hole concentration of the p-type lower cladding layer 303 was controlled to be about $1\times10^{18}$ cm$^{-3}$, and the layer thickness thereof was controlled to be about 500 nm. The layer thickness of the light-emitting layer 304 was controlled to be about 150 nm, and the electron concentration thereof was controlled to be about $5\times10^{16}$ cm$^{-3}$.

On the light-emitting layer 304, an n-type upper cladding layer 305 was overlaid. The upper cladding layer 305 was constructed by overlaying first to third n-type layers 305a to 305c, each having a different electron concentration. The first n-type layer 305a was a Si doped layer with a layer thickness of about 1 μm, which was constructed of an n-type $(Al_{0.7}Ga_{0.3})_{0.5}In_{0.5}P$ layer with an electron concentration of $7\times10^{17}$ cm$^{-3}$. The second n-type layer 305b was a Si doped layer with a layer thickness of about 100 nm, which was constructed of an n-type $(Al_{0.7}Ga_{0.3})_{0.5}In_{0.5}P$ layer with an electron concentration of $9\times10^{16}$ cm$^{-3}$. The third n-type layer 305c was a Se doped layer with a layer thickness of about 100 nm, which was constructed of an n-type $(Al_{0.7}Ga_{0.3})_{0.5}In_{0.5}P$ layer with an electron concentration of $2\times10^{19}$ cm$^{-3}$.

On the surface of the upper cladding layer 305, there was overlaid a window layer 306 composed of an Al doped ZnO by a radio-frequency sputtering method in general use. The electroconductive transparent window layer 306 was constructed of an n-type zinc oxide layer having a specific resistance of about $3\times10^{-4}$ Ω·cm at room temperature, with a layer thickness of about 200 nm. An X-ray diffraction analysis indicated that the zinc oxide used in the window layer 306 had an orientation in the direction of <0001> (C axis) and was polycrystalline.

On the zinc oxide window layer 306, an Al circular electrode 307 with a diameter of about 110 μm was provided, using a photolithographic technique in general use. A gold.zinc alloy (Au:98 wt. %-Zn:2 wt. % alloy) was vacuum deposited on the entire back surface of the GaAs substrate 301, and subjected to alloying treatment at 420° C. for 2 minutes, thereby providing a p-type ohmic electrode 308. This was then diced into separate chips which were approximately in the form of a square with one side length being about 350 μm, thereby forming LED 30.

A current of 20 mA was caused to flow in a forward direction between the aluminum electrode 307 and the p-type ohmic electrode 308. The result was that an almost uniform reddish orange light emission was obtained from approximately the entire surface of the zinc oxide window layer 306. The wavelength of the emitted light, measured by a spectrometer, was about 620 nm. The light emission with excellent monochromatic property was obtained, with the full width half maximum of the emission spectrum being about 17 nm. The forward voltage (@ 20 mA) was about 2.1 V. The emitted light intensity reached about 48 mcd.

Example 2

Figure 6:
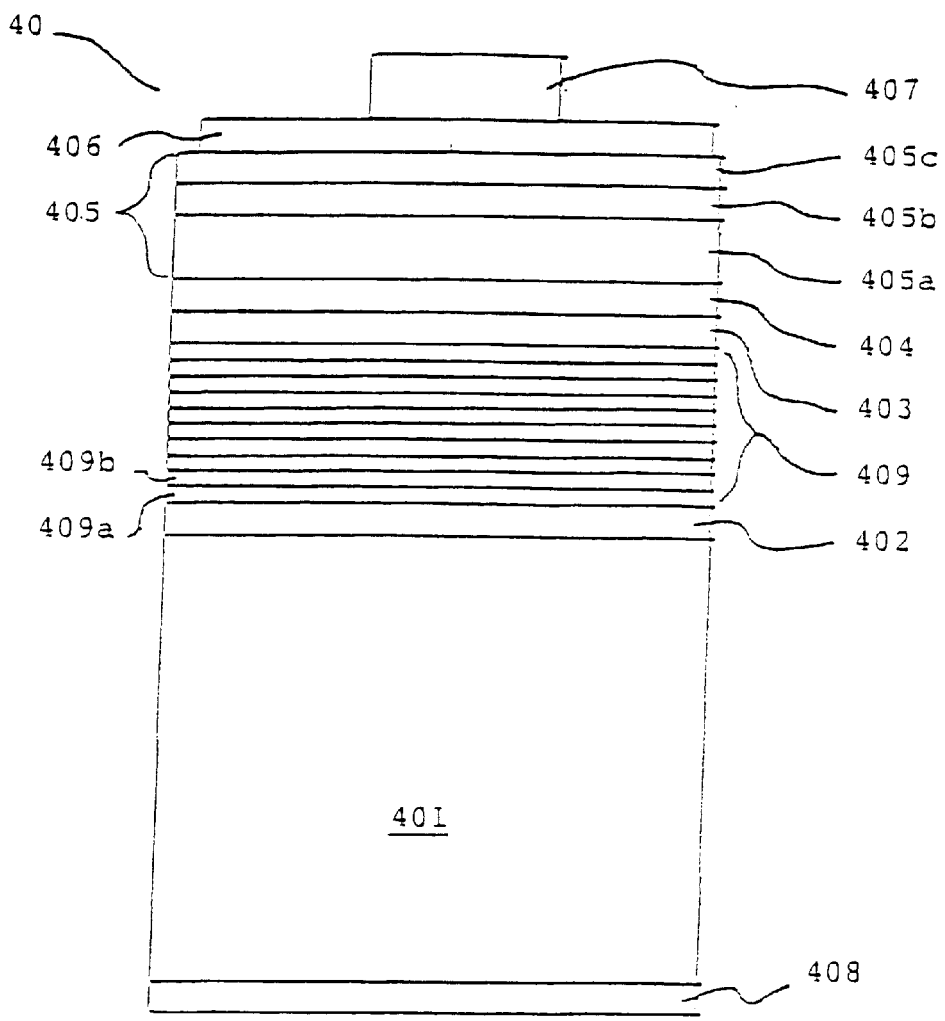
FIG. 6 is a schematic plan view of an LED described in Example 2.

The present invention is explained in greater detail with reference to an example of an (AlGa)InP LED provided with a Bragg reflection layer. FIG. 6 is a schematic cross sectional view of an LED 40, which is an example of the present invention.

On a Zn doped (100) p-type (100)-GaAs substrate 401 (electron concentration: $3\times10^{19}$ cm$^{-3}$), with 1020 off in the ([110] direction, a Mg doped p-type GaAs buffer layer 402 was overlaid by a reduced pressure MO-VPE method in general use, using trimethyl aluminum (($CH_3)_3Al$), trimethyl gallium (($CH_3)_3Ga$), and trimethyl indium (($CH_3)_3In$) as the raw materials for group III constituent elements. The layer thickness of the p-type GaAs buffer layer 402 was controlled to be about 0.2 μm, and the positive hole concentration thereof was controlled to be $3\times10^{18}$ cm$^{-3}$.

On the buffer layer 402, a Bragg reflection layer 409 was overlaid. The Bragg reflection layer 409 was composed of five overlaid pairs of a Mg doped n-type $Al_{0.45}Ga_{0.55}As$ layer 409a with an Al composition ratio of 0.45 and a Mg doped n-type $Al_{0.90}Ga_{0.10}As$ layer 409b with an Al composition ratio of 0.90. The first Bragg reflection layer constituting layer 409a composed of the $Al_{0.45}Ga_{0.55}As$ layer was controlled to have a layer thickness of about 42 nm, and the second Bragg reflection layer constituting layer 409b composed of the $Al_{0.71}Ga_{0.10}As$ layer was controlled to have a layer thickness of about 49 nm. Both the constituting layers 409a and 409b for the Bragg reflection layer 409 were controlled so as to have a positive hole concentration of about $1\times10^{18}$ cm$^{-3}$.

On the Bragg reflection layer 409, a lower cladding layer 403 composed of a Mg doped p-type $(Al_{0.7}Ga_{0.3})_{0.5}In_{0.5}P$ was overlaid. The layer thickness of the lower cladding layer 403 was controlled to be about 0.8 μm, and the positive hole concentration thereof was controlled to be about $3\times10^{18}$ cm$^{-3}$. On the p-type lower cladding layer 403, a light-emitting layer 404 composed of an undoped $(Al_{0.2}Ga_{0.8})_{0.5}In_{0.5}P$ mixed crystal was overlaid. The layer thickness of the light-emitting layer 404 was controlled to be about 100 nm and the hole concentration thereof was controlled to be about $8\times10^{16}$ cm$^{-3}$.

On the light-emitting layer 404, an upper cladding layer 405 composed of an n-type $(Al_{0.7}Ga_{0.3})_{0.5}In_{0.5}P$ was overlaid. The upper cladding layer 405 was composed of a first n-type $(Al_{0.7}Ga_{0.3})_{0.5}In_{0.5}P$ layer, a second n-type $(Al_{0.7}Ga_{0.3})_{0.5}In_{0.5}P$ layer, and a third n-type $(Al_{0.7}Ga_{0.3})_{0.5}In_{0.5}P$ layer. The first n-type layer 405a which was disposed by junction with the light-emitting layer 404 was composed of a Si doped n-type $(Al_{0.7}Ga_{0.3})_{0.5}In_{0.5}P$ with an electron concentration of about $3\times10^{18}$ cm$^{-3}$ and a layer thickness of about 1.7 μm. The second n-type layer 405b was composed of an n-type $(Al_{0.7}Ga_{0.3})_{0.5}In_{0.5}P$ doped with Si, with a layer thickness of about 80 nm and an electron concentration of $2\times10^{17}$ cm$^{-3}$. The electron concentrations for the first and second n-type layers 405a and 405b were changed with the flow rate of disilane ($Si_2H_6$) added to serve as a doping source for Si being uninterruptedly changed with time. The third n-type layer 405c was composed of an n-type $(Al_{0.7}Ga_{0.3})_{0.5}In_{0.5}P$ layer doped with Se in high concentration, which layer is controlled to have an electron concentration of about $1\times10^{19}$ cm$^{-3}$ and a layer thickness of about 100 nm.

On the third n-type layer 405c, a zinc oxide window layer 406 was formed by an electron beam vacuum deposition method, using as a raw material therefor a solid molded material (pellets) composed of zinc oxide with an Al weight content of 3 wt. % and an In weight content of 1.0 wt. %. The n-type zinc oxide of which the window layer 406 was constructed had a specific resistance of about $4\times10^{-4}$ Ω·cm according to the measurement thereof by a Hall effect measurement method. The electron concentration of the window layer 406 was estimated to be about $9\times10^{19}$ cm$^{-3}$. The layer thickness of the window layer 406 was controlled to be about 100 nm.

An Al electrode 407 and a p-type ohmic electrode 408 were formed in the same manner as described in Example 1, whereby an LED 40 was fabricated. A driving current of 20 mA was caused to flow in a forward direction. The result was that a reddish orange light with a wavelength of about 620 nm was emitted, passing through almost the entire surface of the zinc oxide window layer 406. The full width half maximum (FWHM) of the emission spectrum was about 18 nm. Light emission with excellent monochromatic property was produced. The forward voltage was about 1.9 V at a current of 20 mA. The light emission intensity reached about 90 mcd.

When an n-type upper cladding layer is constructed in an n-side-up type AlGaInP light-emitting diode in accordance with the present invention, a high brightness light-emitting diode with a simple layered structure can be provided.

While the invention has been described in detail and with reference to specific embodiments thereof, it will be apparent to one skilled in the art that various changes and modifications can be made therein without departing from the spirit and scope thereof.

What is claimed is:

1. A light-emitting diode comprising:

a p-type GaAs single crystal substrate having provided thereon in the following order a p-type lower cladding layer, a light-emitting layer, and an n-type upper cladding layer, each layer of which is represented by $(Al_XGa_{1-X})_YIn_{1-Y}P$ ($0 \leq X \leq 1$, $0 \leq Y \leq 1$) including the case where each layer has different mixed crystal ratios X, Y, wherein said n-type upper cladding layer includes three n-type layers, each layer having a different electron concentration and being represented by $(Al_XGa_{1-X})_YIn_{1-Y}P$ ($0 \leq X \leq 1$, $023 Y \leq 1$) including the case where each layer has different mixed crystal ratios X, Y, wherein said three n-type layers being referred to as a first n-type layer with an electron concentration of n1 and a layer thickness of d1, a second n-type layer with an electron concentration of n2 and a layer thickness of d2, and a third n-type layer with an electron concentration of n3 and a layer thickness of d3 counted in the order from the layer on the side near said light-emitting layer, wherein the electron concentrations of said three layers being in the relationship of n3>n1>n2, and a window layer composed of a metal oxide, which is provided on said n-type upper cladding layer.

2. The light-emitting diode as claimed in claim 1, wherein the mixed crystal ratio (1–Y) of In in each of said p-type lower cladding layer, said light-emitting layer, and said n-type upper cladding layer is 0.5.

3. The light-emitting diode as claimed in claim 1 or claim 2, wherein said window layer is in contact with said third n-type layer.

4. The light-emitting diode as claimed in claim 1 or 2, wherein the layer thicknesses of said first to third n-type layers are in the relationship of d1>d3≧d2.

5. The light-emitting diode as claimed in claim 1 or 2, wherein the electron concentration of said second n-type layer is $1 \times 10^{16}$ cm$^{-3} \leq n2 \leq 5 \times 10^{17}$ cm$^{-3}$.

6. The light-emitting diode as claimed in claim 1 or 2, wherein the layer thickness of said second n-type layer is 20 nm≦d2≦200 nm.

7. The light-emitting diode as claimed in claim 1 or 2, wherein a dopant for said first and second n-type layers is Si, and a dopant for said third n-type layer is Se or Te.

8. The light-emitting diode as claimed in claim 1 or 2, wherein said window layer has an n-type conductivity.

9. The Hght-emitting diode as claimed in claim 1 or 2, wherein said window layer is constructed of at least one material selected from the group consisting of indium-tin oxide, indium oxide, tin oxide, zinc oxide, and magnesium oxide.

10. The light-emitting diode as claimed in claim 9, wherein said zinc of which said window layer is constructed comprises one of aluminum, fallium or indium.

11. The light-emitting diode as claimed in claim 1 or 2, wherein said p-type GaAs single crystal substrate has an electron concentration in the range of $5 \times 10^{18}$ to $5 \times 10^{19}$ cm$^{-3}$.

* * * * *